United States Patent
Elliott et al.

(10) Patent No.: US 10,278,288 B2
(45) Date of Patent: Apr. 30, 2019

(54) INDUCTIVE SENSOR FOR SHOCK ABSORBER

(71) Applicant: KSR IP Holdings, LLC, Wilmington, DE (US)

(72) Inventors: Ryan W. Elliott, Chatham (CA); Lingmin Shao, Ridgetown (CA); Shaun Fuller, Ridgetown (CA); Benjamin Scott Hill, Dresden (CA)

(73) Assignee: KSR IP Holdings, LLC, Wilmington, DE (US)

( * ) Notice: Subject to any disclaimer, the term of this patent is extended or adjusted under 35 U.S.C. 154(b) by 78 days.

(21) Appl. No.: 15/493,650

(22) Filed: Apr. 21, 2017

(65) Prior Publication Data

US 2017/0307412 A1    Oct. 26, 2017

Related U.S. Application Data

(60) Provisional application No. 62/396,433, filed on Sep. 19, 2016, provisional application No. 62/329,538, filed on Apr. 29, 2016, provisional application No. 62/326,208, filed on Apr. 22, 2016.

(51) Int. Cl.
   *H05K 1/16*    (2006.01)
   *G01D 5/22*    (2006.01)

(52) U.S. Cl.
   CPC .......... *H05K 1/165* (2013.01); *G01D 5/2241* (2013.01); *H05K 2201/086* (2013.01); *H05K 2201/1003* (2013.01); *H05K 2201/10151* (2013.01)

(58) Field of Classification Search
   CPC .......... G01D 5/204; H05K 2201/1003; H05K 2201/10151; H05K 1/181
   See application file for complete search history.

(56) References Cited

U.S. PATENT DOCUMENTS

| | | | | |
|---|---|---|---|---|
| 4,507,639 A | * | 3/1985 | Trenkler | G01D 5/204 336/115 |
| 5,233,293 A | * | 8/1993 | Huang | B60G 17/01933 188/1.11 E |
| 6,012,050 A | | 1/2000 | Eaton et al. | |
| 6,064,284 A | | 5/2000 | Wakamatsu et al. | |
| 7,215,112 B1 | * | 5/2007 | Recio | G01D 5/145 324/207.11 |
| 2003/0222744 A1 | * | 12/2003 | Clymer | G01D 5/2013 336/110 |
| 2005/0230200 A1 | * | 10/2005 | Seror | B64C 25/60 188/266 |
| 2008/0189010 A1 | * | 8/2008 | Cubalchini | B60G 17/01933 701/37 |

(Continued)

OTHER PUBLICATIONS

International Search Report; PCT/US2017/028874, filed Apr. 21, 2017.

*Primary Examiner* — Tung X Nguyen
*Assistant Examiner* — Dominic E Hawkins
(74) *Attorney, Agent, or Firm* — Dinsmore & Shohl LLP

(57) ABSTRACT

An inductor sensor assembly for determining to position of object includes a layer of ferrite overlaying exciting and receiving coils formed on a substrate. A magnet attached to the target produces a virtual coupler in an area of ferrite overlaying the coils. An application for a shock absorber includes a sensor module mounted in a recess in a dust cover and a magnet mounted to a cylinder tube of the shock absorber.

14 Claims, 4 Drawing Sheets

(56) References Cited

U.S. PATENT DOCUMENTS

| | | |
|---|---|---|
| 2013/0033407 A1 | 2/2013 | Chae et al. |
| 2013/0043863 A1* | 2/2013 | Ausserlechner ....... G01D 5/145 324/207.2 |
| 2013/0181797 A1 | 7/2013 | Hickox |
| 2014/0144223 A1 | 5/2014 | Knechtges et al. |
| 2014/0327432 A1* | 11/2014 | Elliott .................. G01D 5/2066 324/207.16 |
| 2015/0027232 A1* | 1/2015 | Matsumoto ............. G01F 1/582 73/861.11 |
| 2015/0180128 A1* | 6/2015 | Ishikura ................... H01Q 7/06 343/788 |
| 2015/0247718 A1* | 9/2015 | Hoglund ................ G01B 7/003 324/207.15 |
| 2016/0086482 A1* | 3/2016 | Hanrahan ............ G08B 29/046 340/506 |

* cited by examiner

INDUCTIVE SENSOR FOR SHOCK ABSORBER

CROSS-REFERENCE TO RELATED APPLICATIONS

This application claims priority of U.S. Provisional Patent Application Ser. No. 62/326,208 filed Apr. 22, 2016; 62/329,538 filed Apr. 29, 2016; and 62/396,433 filed Sep. 19, 2016 which are incorporated herein by reference.

FIELD OF THE INVENTION

The invention relates to inductive sensors and more particularly to inductive sensors using a resonator, exciting coils, and receiving coils which are coupled to determine the position of an object.

BACKGROUND OF THE INVENTION

Inductive sensors are well known in the art. A typical inductive sensors arrangement has exciting coils and receiving coils. A resonator is connected to the exciting coils. A movable coupler couples the coils to create eddy currents in the receiving coil. The coupler is attached to a target. When the target and coupler move, the magnitude of the eddy currents changes in proportion to the position of the coupler. The position of the coupler and target is then determined. However, these couplers are a disadvantage in that they cannot be used through conductive materials such as aluminum. Presently known inductive sensors cannot be used in applications where the target is housed in aluminum.

SUMMARY OF THE INVENTION

An inductive sensor assembly for determining the position of a target on an object movable with respect to the sensor includes a substrate having at least one transmitting coil and at least one receiving coil mounted to the substrate, a resonator connected to the transmitting coils, a layer of ferrite covering the at least one transmitting coil and at least one receiving coil, a processing module connected to the receiving coil to measure the differential coupling and produce a signal, and a magnet mounted to the movable object spaced apart from the layer of ferrite.

A particular application for the sensor assembly includes a housing, a sensor module mounted to the housing, and a sensor module having at least one receiving coil and at least one exciting coil, a layer of ferrite covering the receiving coil and the exciting coil, a shock absorber having an outer cylinder tube, and a magnet mounted to the outer cylinder tube.

BRIEF DESCRIPTION OF THE DRAWINGS

FIG. 2 is a side view of a sensor assembly and shock absorber coupler region.

DETAILED DESCRIPTION OF THE INVENTION

Figure 1:
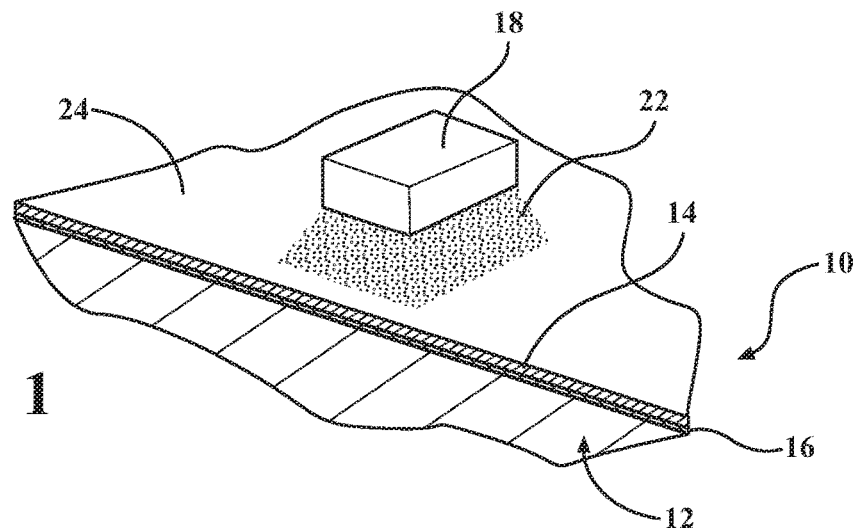
FIG. 1 is a perspective partial view of a sensor in accordance with the invention.
Figure 2:
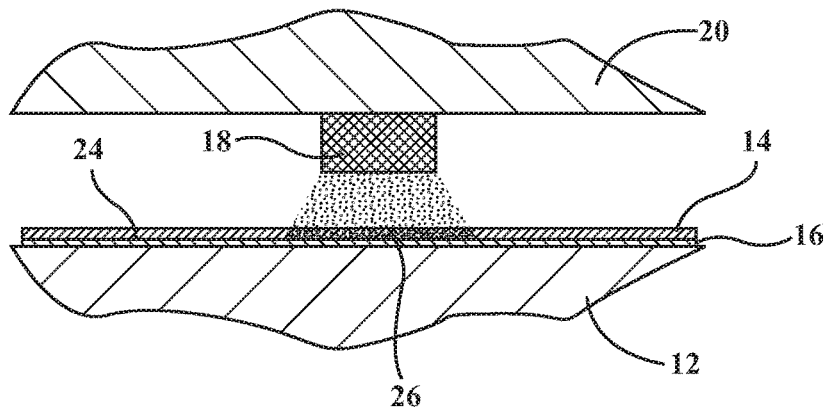
FIG. 2 is partial cross sectional view of magnet and sensor module in accordance with the invention.

As shown in FIGS. 1 and 2, a novel inductive position sensor assembly 10 has a substrate 12 with coils 16 covered with a layer of ferrite 14. A strong permanent magnet 18 attached to a movable target 20. The magnet 18 causes an area 22 of low permeability in the layer of ferrite 14 adjacent to the magnet 18. The coupler region 22 of layer of ferrite 14 becomes saturated. The permeability of the saturated area 22 drops to one when compared with the adjacent unsaturated regions 24 of the layer of ferrite 14 where the permeability is much higher. The saturated area 22 then acts as a "virtual coupler" 26 for the underlying area of the coils 16. The virtual coupler 26 permits a resonator 58 (FIG. 4) to excite exciting coils 30 (FIG. 3) and to generate eddy currents in receiving coils 32 (FIG. 3) in the same fashion as traditional inductive couplers. A suitable ferrite is one that has high magnetic permeability greater than ten. The ferrite should also have minimal eddy loses up to 5 MHz beyond the range of the inductive sensor. The eddy currents produced are proportional to the distance that the region or virtual coupler is from the end of the coils. The sensor assembly 10 can be used with movable targets formed of aluminum.

Figure 3:
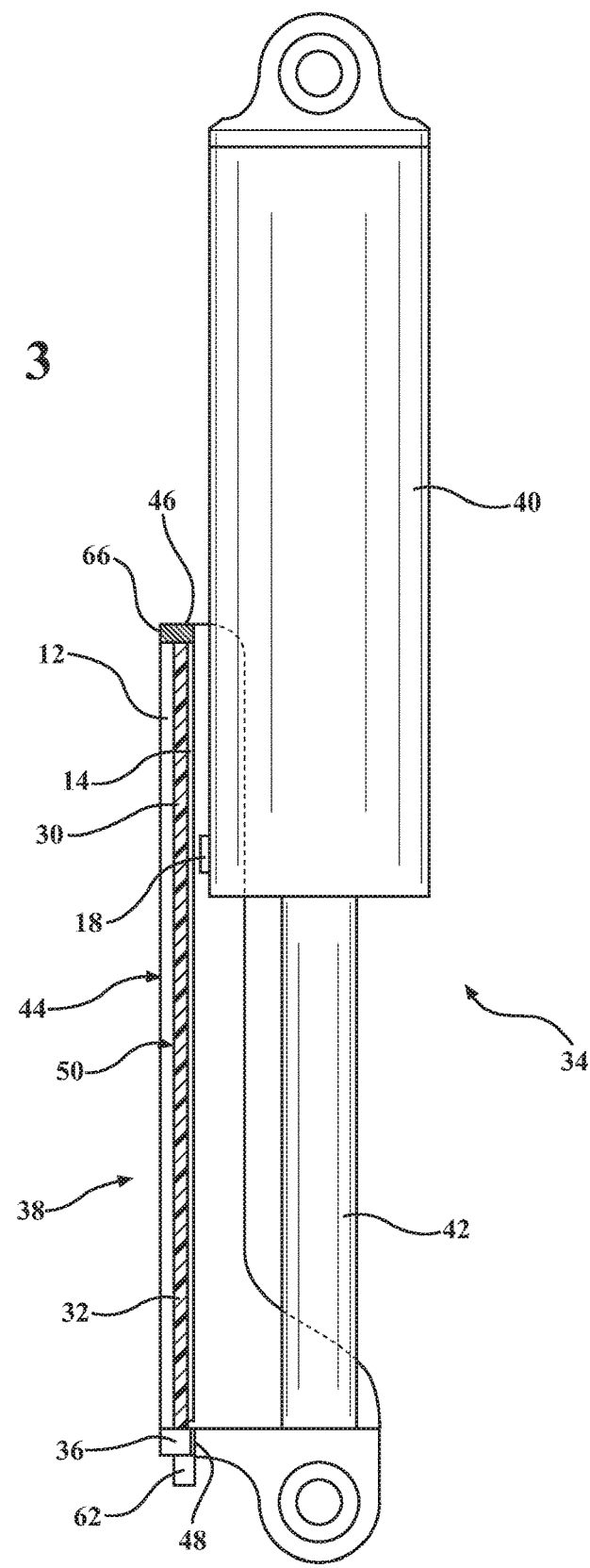
FIG. 3 is a side view of a sensor assembly used with a shock absorber.
Figure 4:
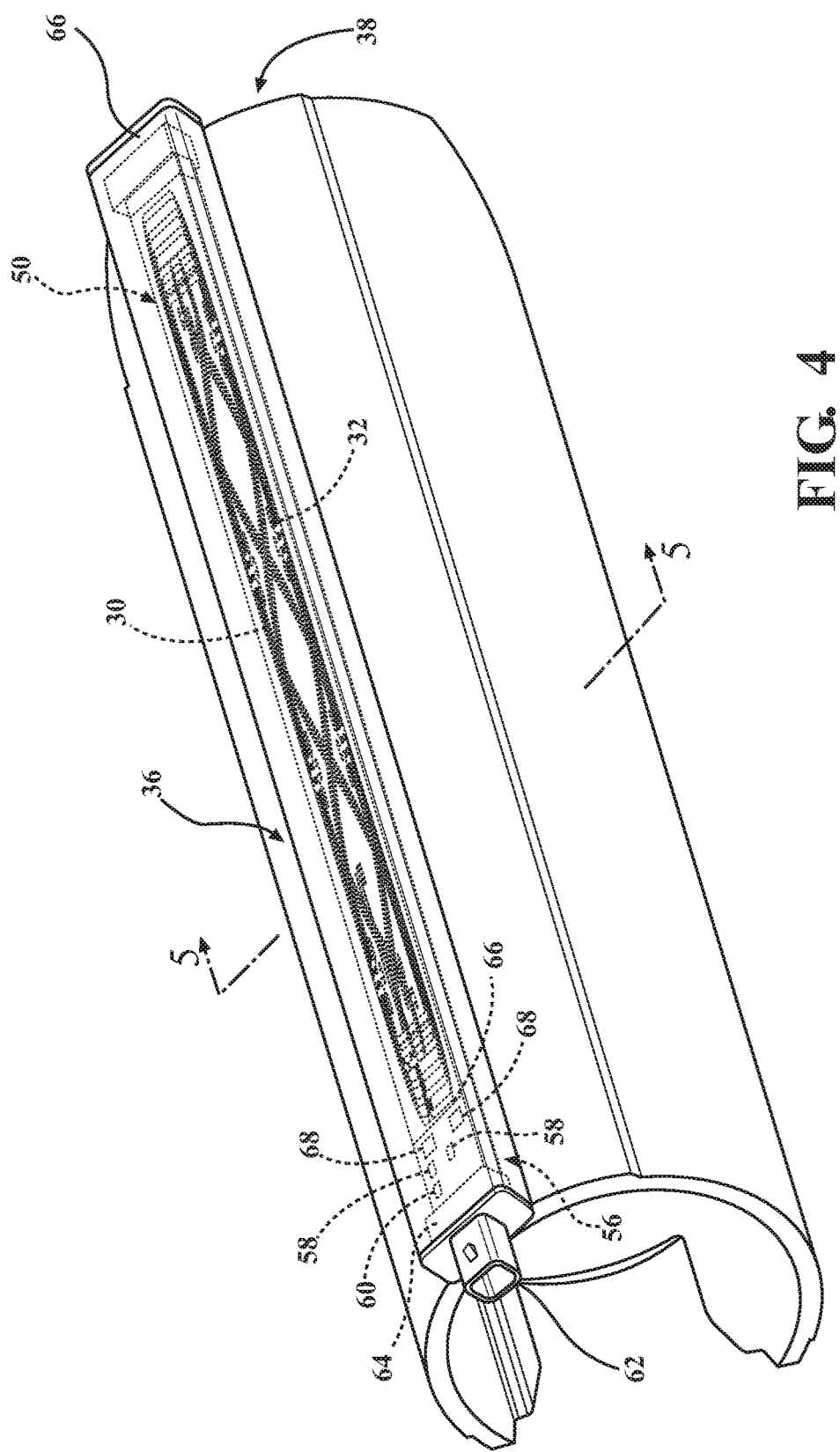
FIG. 4 is a perspective view of a sensor module installed in a dust cover for a shock absorber.
Figure 5:
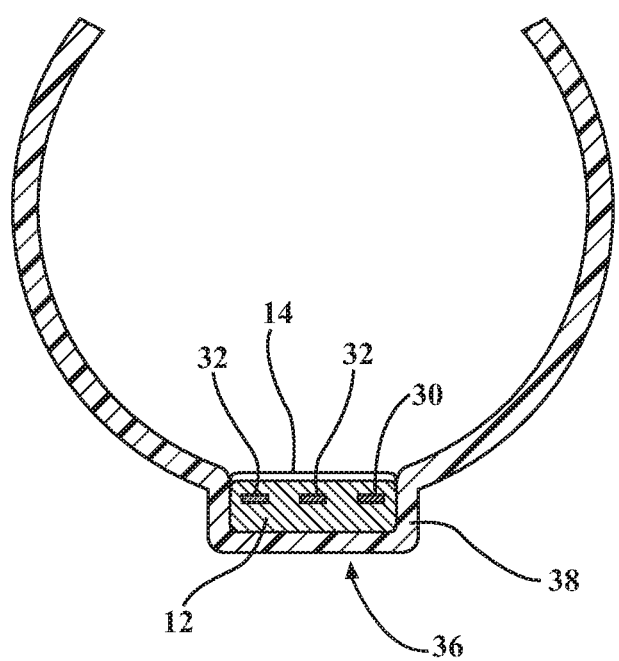
FIG. 5 is a cross section view of a dust cover.

A specific application of a sensor assembly 10 for use in determining the position of a shock absorber 34 is shown in FIGS. 3, 4, and 5. Although the sensor assembly 10 is shown for use with a shock absorber 34, the sensor assembly 10 may be used for determining the position of virtually any target movable with respect to a sensor module. The sensor assembly 10 includes a sensor module 36 which is mounted in a dust cover 38 for the shock absorber 34. The magnet 18 is mounted to an outer tube 40 of the shock absorber 34. The outer tube 40 may be cylindrical and may be aluminum. The dust cover 38 is positioned so that there is a gap of 5 to 10 mm between the magnet 18 and the layer of ferrite 14. The magnet 18 is rectangular and is 20×12×5 mm, NdFe42, full sintered/pressed. The magnet 18 has strength of 0.5 T. The strength of the magnet 18 is chosen with respect to nature of the application. The position of the outer tube 40 relative to the dust cover 38 and a ram 42 may be determined by the sensor assembly 10.

As shown in FIGS. 3 and 5, the dust cover 38 has a generally circular cross section with a longitudinal recess 44. The recess 44 is formed to hold the sensor module 36 a predetermined distance or gap from the magnet 18. The recess 44 is generally U shaped and extends between a top 46 to a bottom 48 of the dust cover 38. The dust cover 38 is extruded from a suitable nylon and is fixedly mounted with an end of member supporting the ram 42 of the shock absorber.

As shown in FIG. 4, the sensor module 36 includes a printed wiring board (PWB) 50. The PWB 50 has exciting coils 30 and receiving coils 32 arranged on a substrate 12. The sensor module 36 also includes a printed wiring assembly (PWA) 56 which includes a resonator 58 and ASIC chips 60. The PWB 50 is a generally rectangular board and can be as long as 200 mm. The PWA 56 and PWB 50 are soldered together and a connector 62 is mounted with a molded extension 64 to the PWA 56. The PWB 50 and PWA 56 are separate for efficiency reasons. The PWB 50 and PWA 56 are soldered together via terminals pins 66 to complete the subassembly. Both boards are heat staked to the molded extension 64 of the connector 62 to limit stress on the soldered connections. The connector 62 is configured for delivering an output of the sensor module 10 and is over molded onto the PWA 56 having the ASIC 60. The connector 62 has terminals for connecting into the bus in a vehicle to deliver signals to a vehicle controller. A multi rib silicon radial compression seal 66 is epoxied or glued over the opposite end of the longitudinal recess 44 channel of the dust cover to seal the sensor module 36 in the dust cover 38.

The top surface of the PCB 50 is covered with a layer of ferrite 14. In the preferred embodiment the layer of ferrite 14 is a flexible sheet approximately 1/10 mm thick and having an adhesive layer on one side for mounting to the PCB 50. The flexible ferrite sheet permits forming the shape of the sensor module to conform to the environment. Likewise, the PCB 50 may be formed of flexible material and covered with a flexible ferrite sheet to form a flexible sensing unit such as a tube. The thickness of the ferrite layer can be varied to resist stray magnetic fields. The thicker the layer of ferrite more resistant the sensor is to the effects of the stray magnetic field.

As set forth above, the magnet 18, creates a coupler region 22 of low permeability in the ferrite 14 layer adjacent to the magnet 18. The coupler region 22 couples the exciting coils 30 to the receiving coils 32 to produce the differential coupling. As the target 20 and magnet 18 move longitudinally along the sensor module 36 the percentage of voltage with respect to a reference voltage for the coils 32 increases linearly.

The primary advantage of the sensor assembly 10 is the ability to operate effectively when one of the components is a conductive material such as aluminum. However, the module can be used in virtually any environment and can be configured to determine the position of objects which move linearly with respect to the sensor module or could be configured for use with objects that move rotationally with respect to a sensor module.

Thus it will be apparent to those skilled in the art that there are many variations and adaptations of the invention which are within the scope of the invention as defined by the claims.

The invention claimed is:

1. An inductive sensor assembly for determining a position of a target on an object, the inductive sensor assembly comprising:
    a substrate having at least one transmitting coil and at least one receiving coil mounted to the substrate;
    a resonator connected to the at least one transmitting coil;
    a processing module connected to the at least one receiving coil, the processing module measuring eddy currents produced in the receiving coil;
    a layer of ferrite having magnetic permeability greater than 10 covering the at least one transmitting coil and the at least one receiving coil;
    a magnet mounted to a movable object spaced apart from the layer of ferrite, the magnet producing a magnetic field acting on an area of the ferrite layer to inductively couple the at least one transmitting coil with the at least one receiving coil in a region adjacent the area.

2. The sensor assembly of claim 1, wherein the substrate is a printed wiring board having a top surface.

3. The sensor assembly of claim 1, wherein the layer of ferrite has one side having an adhesive.

4. The sensor assembly of claim 2, wherein the layer of ferrite is mounted to the top surface of the printed wiring board.

5. The sensor assembly of claim 1, wherein the layer of ferrite is flexible.

6. The sensor assembly of claim 1, wherein the object is formed of aluminum non-magnetic material.

7. A sensor assembly for sensing a position of a shock absorber, the sensor assembly comprising:
    a housing;
    a sensor module mounted to the housing, the module having at least one transmitting coil and at least one receiving coil, the module further having a layer of ferrite covering the at least one transmitting coil and at least one receiving coil;
    a magnet mounted to the shock absorber, the magnet spaced apart from the ferrite layer, the magnet having a magnetic field action on the ferrite layer to inductively couple the at least one transmitting coil to the at least one receiving coil to produce a signal indicative of the position of the magnet and object relative to the housing.

8. The sensor assembly of claim 7, wherein the housing has a generally circular cross section defining a center cavity.

9. The sensor assembly of claim 7, wherein the housing has a recess for housing the sensor module.

10. The sensor assembly of claim 7, wherein the shock absorber has an aluminum tube movable with respect to a rod.

11. The sensor assembly of claim 7, wherein the sensor module includes a connector.

12. The sensor assembly of claim 7, wherein the sensor module includes a printed wire board and a printed wire assembly.

13. The sensor assembly of claim 12, wherein the printed wire assembly includes a resonator.

14. The sensor assembly of claim 13, wherein the printed wire board includes at least one exciting coil and at least one receiving coil.

* * * * *